US010859655B2

(12) United States Patent
Jin et al.

(10) Patent No.: US 10,859,655 B2
(45) Date of Patent: Dec. 8, 2020

(54) HYBRID INVERSION PULSE FOR MAGNETIC RESONANCE IMAGING

(71) Applicant: Siemens Healthcare GmbH, Erlangen (DE)

(72) Inventors: Jin Jin, Algester (AU); Xiaoming Bi, Oak Park, CA (US); Fei Han, Beverly Hills, CA (US)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/385,374

(22) Filed: Apr. 16, 2019

(65) Prior Publication Data

US 2020/0333415 A1 Oct. 22, 2020

(51) Int. Cl.
*G01R 33/56* (2006.01)
*G01R 33/563* (2006.01)

(52) U.S. Cl.
CPC ..... *G01R 33/5602* (2013.01); *G01R 33/5635* (2013.01)

(58) Field of Classification Search
CPC ............. G01R 33/5602; G01R 33/5635
See application file for complete search history.

(56) References Cited

U.S. PATENT DOCUMENTS

| 6,441,613 B1* | 8/2002 | Rosenfeld | G01R 33/446 324/307 |
|---|---|---|---|
| 2002/0153889 A1* | 10/2002 | Garwood | G01R 33/4616 324/307 |
| 2012/0146639 A1* | 6/2012 | Sorensen | G01R 33/4633 324/309 |
| 2014/0035580 A1* | 2/2014 | Andronesi | G01R 33/5602 324/309 |
| 2015/0245778 A1* | 9/2015 | Holscher | A61B 5/0042 600/419 |
| 2016/0334491 A1* | 11/2016 | Guo | G01R 33/56366 |

OTHER PUBLICATIONS

Silver, M. S. et al., "Highly Selective $\pi/2$ and $\pi$ Pulse Generation", Journal of Magnetic Resonance 59, Department of Electrical Engineering and Computer Science, the Johns Hopkins University, National Institutes of Health, Apr. 16, 1984, pp. 347-351, 5 pages.

(Continued)

*Primary Examiner* — G. M. A Hyder

(57) ABSTRACT

An imaging system includes determination of a first gradient-modulated offset-independent adiabaticity pulse associated with a first bandwidth and a first gradient strength, determination of a second gradient-modulated offset-independent adiabaticity pulse associated with a second bandwidth less than the first bandwidth and a second gradient strength less than the first gradient strength, determination of a third asymmetric adiabatic pulse based on the first gradient-modulated offset-independent adiabaticity pulse and the second gradient-modulated offset-independent adiabaticity pulse, and control of a radio frequency system and gradient system to apply the third asymmetric adiabatic pulse to patient tissue.

15 Claims, 5 Drawing Sheets

(56) References Cited

OTHER PUBLICATIONS

Conolly, Steven et al., "Variable-Rate Selective Excitation", Journal of Magnetic Resonance 78, Magnetic Resonance Systems Research Laboratory, Stanford University, pp. 440-458, 1988, 19 pages.
Conolly, Steven et al., "A Reduced Power Selective Adiabatic Spin-Echo Pulse Sequence", Magnetic Resonance in Medicine 18, Department of Electric Engineering, Stanford University, 1991, pp. 28-38, 11 pages.
Kupce, Eriks et al., "Stretched Adiabatic Pulses for Broadhand Spin Inversion", Journal of Magnetic Resonance, Series A 117, Varian NMR Instruments, Department of Chemistry, Cambridge University, 1995, pp. 246-256, 11 pages.
Ordidge, Roger J., et al. "Frequency offset corrected inversion (FOCI) pulses for use in localized spectroscopy" Magnetic resonance in medicine 36.4 (1996): 562-566.
Tannús, Alberto et al., "Adiabatic Pulses", NMR in Biomedicine, Center for Magnetic Resonance Research and Department of Radiology, University of Minnesota, vol. 10, 1997, pp. 423-434, 12 pages.
Andronesi, Ovidiu C., et al. "Spectroscopic imaging with improved gradient modulated constant adiabaticity pulses on high-field clinical scanners." Journal of Magnetic Resonance 203.2 (2010): 283-293., 23 pages.
Jin, Jin, et al. "Improving SAR estimations in MRI using subject-specific models." Physics in Medicine & Biology 57.24 (2012): 8153., 20 pages.

* cited by examiner

HYBRID INVERSION PULSE FOR MAGNETIC RESONANCE IMAGING

BACKGROUND

Many magnetic resonance applications require preparation of longitudinal magnetization using spectrally- or spatially-selective inversion pulses. Frequency-modulated adiabatic full passage (AFP) pulses are commonly used for these applications, due to their high selectivity (i.e., sharpness of transition between inverted and non-inverted regions) and homogeneity (i.e., profile within the inverted region), as compared to conventional amplitude-modulated pulses.

High (e.g., $B_0>3T$) and ultra-high (e.g., $B_0>7T$) field strengths present several technical challenges for selective inversion, including increased inhomogeneity of $B_0$ fields and radiofrequency magnetic fields ($B_1$), as well as elevated radiofrequency (RF) energy deposition, typically measured as specific absorption rate (SAR). Inhomogeneous $B_0$ fields impede high selectivity and require AFP pulses of higher bandwidth (BW). However, the higher frequency sweeping speed associated with the higher BW may cause these high-BW AFP pulses to lose their adiabatic characteristics, since adiabaticity requires that the $B_1$ strength is sufficiently large relative to the speed of frequency sweep.

Variable rate selective excitation (VERSE) inversion pulses have been proposed to effectively reduce the peak RF amplitude and overall RF energy of the inversion pulse. However, a VERSE pulse does not provide improved inversion selectivity, because the inversion pulse plays out at a slower rate near the peak of RF amplitude. Frequency offset corrected inversion (FOCI) pulses may provide enhanced selectivity in the presence of $B_0$ inhomogeneity, but also provide a nonuniform inversion profile with insufficient $B_1$ amplitude. Gradient-modulated offset-independent adiabaticity (GOIA) pulses provide improved selectivity, inversion band homogeneity and substantially constant on-resonance adiabaticity by scaling up the slice-selective gradient amplitude while the RF amplitude- and frequency-modulation are calculated. However, the applicability of GOIA pulses at high and ultra-high field strengths is restricted by the SAR limit.

DETAILED DESCRIPTION

The following description is provided to enable any person in the art to make and use the described embodiments. Various modifications, however, will be readily apparent to those in the art.

In many MR imaging applications, inversion selectivity is only important for one side of a region of interest (ROI). For example, spatially-selective inversion is typically needed for only one side of the ROI in some flow-driven imaging techniques, such as non-contrast-enhanced renal artery imaging and brain arterial spin labelling (ASL). Nevertheless, such imaging applications typically apply a symmetric inversion pulse having similar selectivity performance on both sides of the ROI.

Embodiments provide an asymmetric selective inversion pulse having an accurate inversion profile on a first side of the ROI, while having a less accurate inversion profile on a second side of the ROI. The relaxed performance requirement on the second side is used to shorten the overall pulse duration, reduce peak RF amplitude and reduce the resulting RF energy deposition. An asymmetric inversion pulse according to some embodiments may be used in conjunction with high and ultra-high field strengths while providing a desirable combination of higher selectivity, improved homogeneity, shorter duration and decreased SAR as opposed to conventional adiabatic inversion pulses.

Figure 1:
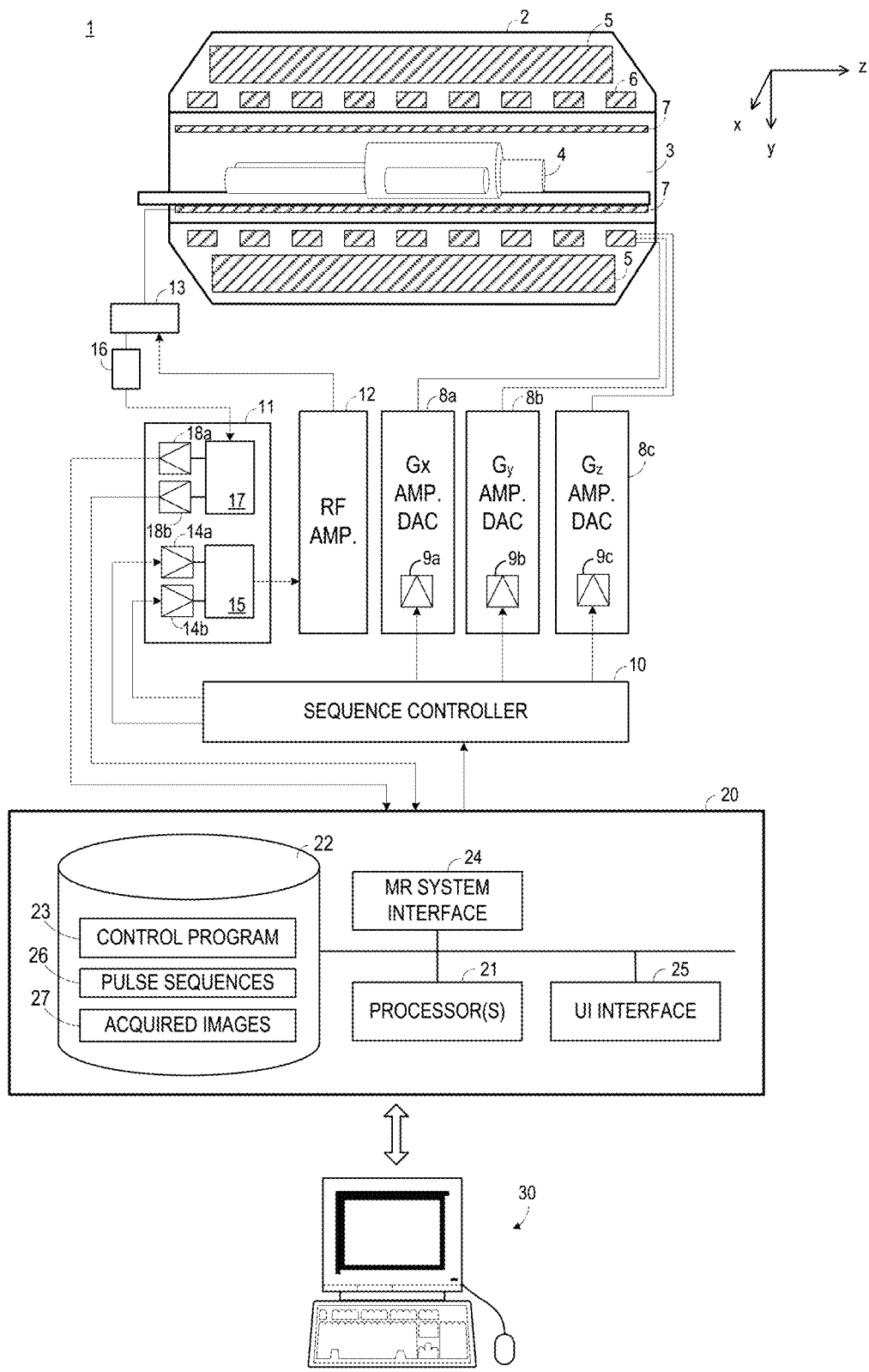
FIG. 1 is a block diagram of an MR system according to some embodiments.

FIG. 1 illustrates MR system 1 according to some embodiments. MR system 1 includes MR chassis 2, which defines bore 3 in which patient 4 is disposed. MR chassis 2 includes polarizing main magnet 5, gradient coils 6 and RF coil 7 arranged about bore 3. According to some embodiments, polarizing main magnet 5 generates a uniform main magnetic field ($B_0$) and RF coil 7 emits an excitation field ($B_1$).

According to MR techniques, a substance (e.g., human tissue) is subjected to a main polarizing magnetic field (i.e., $B_0$), causing the individual magnetic moments of the nuclear spins in the substance to process about the polarizing field in random order at their characteristic Larmor frequency, in an attempt to align with the field. A net magnetic moment $M_z$ is produced in the direction of the polarizing field, and the randomly-oriented magnetic components in the perpendicular plane (the x-y plane) cancel out one another The substance is then subjected to an excitation field (i.e., $B_1$) created by emission of an RF pulse, which is in the x-y plane and near the Larmor frequency, causing the net aligned magnetic moment $M_z$ to rotate into the x-y plane so as to produce a net transverse magnetic moment $M_t$, which is rotating, or spinning, in the x-y plane at the Larmor frequency. The excitation field is terminated and signals are emitted by the excited spins as they return to their pre-excitation field state. The emitted signals are detected, digitized and processed to reconstruct an image using one of many well-known MR reconstruction techniques.

An RF inversion, or saturation, pulse is emitted as a magnetization preparation step in order to enhance or suppress signals from certain tissue so as to generate desired levels of contrast in the resulting image. In a case that inversion selectivity is only important for one side of an ROI in the particular imaging application, the RF inversion pulse may comprise an asymmetric adiabatic inversion pulse according to some embodiments. Characteristics and generation of such an inversion pulse according to some embodiments will be described below.

Gradient coils 6 produce magnetic field gradients $G_x$, $G_y$, and $G_z$ which are used for position-encoding NMR signals. The magnetic field gradients $G_x$, $G_y$, and $G_z$ distort the main magnetic field in a predictable way so that the Larmor frequency of nuclei within the main magnetic field varies as a function of position. Accordingly, an excitation field $B_1$ which is near a particular Larmor frequency will tip the net aligned moment $M_z$ of those nuclei located at field positions which correspond to the particular Larmor frequency, and signals will be emitted only by those nuclei after the excitation field $B_1$ is terminated.

Gradient coils 6 may consist of three windings, for example, each of which is supplied with current by an amplifier 8a-8c in order to generate a linear gradient field in its respective Cartesian direction (i.e., x, y, or z). Each amplifier 8a-8c includes a digital-analog converter 9a-9c which is controlled by a sequence controller 10 to generate desired gradient pulses at proper times.

Sequence controller 10 also controls the generation of RF pulses by RF system 11 and RF power amplifier 12. RF system 11 and RF power amplifier 12 are responsive to a scan prescription and direction from sequence controller 10 to produce RF pulses of the desired frequency, phase, and pulse amplitude waveform. The generated RF pulses may be applied to the whole of RF coil 7 or to one or more local coils or coil arrays. RF coil 7 converts the RF pulses emitted by RF power amplifier 12, via multiplexer 13, into a magnetic alternating field in order to excite the nuclei and align the nuclear spins of the object to be examined or the region of the object to be examined. As mentioned above, RF pulses may be emitted in a magnetization preparation step in order to enhance or suppress certain signals.

The RF pulses are represented digitally as complex numbers. Sequence controller 10 supplies these numbers in real and imaginary parts to digital-analog converters 14a-14b in RF system 11 to create corresponding analog pulse sequences. Transmission channel 15 modulates the pulse sequences with a radio-frequency carrier signal having a base frequency corresponding to the resonance frequency of the nuclear spins in the volume to be imaged.

RF coil 7 both emits radio-frequency pulses as described above and samples the alternating field which is produced as a result of precessing nuclear spins, i.e. the nuclear spin echo signals. The received signals are received by multiplexer 13, amplified by RF amplifier 16 and demodulated in receiving channel 17 of RF system 11 in a phase-sensitive manner. Analog-digital converters 18a and 18b convert the demodulated signals into a real part and an imaginary part.

Computing system 20 receives the real and imaginary parts from analog-digital converters 18a and 18b and reconstructs an image therefrom according to known techniques. System 20 may comprise any general-purpose or dedicated computing system. Accordingly, system 20 includes one or more processing units 21 (e.g., processors, processor cores, execution threads, etc.) configured to execute processor-executable program code to cause system 20 to operate as described herein, and storage device 22 for storing the program code. Storage device 22 may comprise one or more fixed disks, solid-state random access memory, and/or removable media (e.g., a thumb drive) mounted in a corresponding interface (e.g., a USB port).

Storage device 22 stores program code of control program 23. One or more processing units 21 may execute control program 23 to cause system 20 to perform any one or more of the processes described herein. For example, one or more processing units 21 may execute control program 23 to cause system 20 to determine an asymmetric adiabatic inversion pulse for use in an imaging application as described herein. Pulse sequences 26 include data specifying the parameters and timings of pulse sequences and their constituent building blocks and readout events.

One or more processing units 21 may execute control program 23 to cause system 20 to receive the real and imaginary parts of a received RF signal via MR system interface 24 and reconstruct an image therefrom according to known techniques. Such an image may be stored among acquired images 27 of storage device 22.

One or more processing units 21 may also execute control program 23 to provide instructions to sequence controller 10 via MR system interface 24. For example, sequence controller 10 may be instructed to initiate a desired pulse sequence of pulse sequences 26. In particular, sequence controller 10 may be instructed to control the switching of magnetic field gradients via amplifiers 8a-8c at appropriate times, the transmission of radio-frequency pulses having a specified phase and amplitude at specified times via RF system 11 and RF amplifier 12, and the readout of the resulting magnetic resonance signals.

Acquired images 27 may be provided to terminal 30 via terminal interface 25 of system 20. Terminal interface 25 may also receive input from terminal 30, which may be used to provide commands to control program 23 in order to control sequence controller 10 and/or other elements of system 1. The commands may include commands to specify an imaging application, to provide desired parameters and/or characteristics of an inversion pulse, etc. Terminal 30 may simply comprise a display device and an input device coupled to system 20. In some embodiments, terminal 30 is a separate computing device such as, but not limited to, a desktop computer, a laptop computer, a tablet computer, and a smartphone.

Each element of system 1 may include other elements which are necessary for the operation thereof, as well as additional elements for providing functions other than those described herein. Storage device 22 may also store data and other program code for providing additional functionality and/or which are necessary for operation of system 20, such as device drivers, operating system files, etc.

Figure 2A:
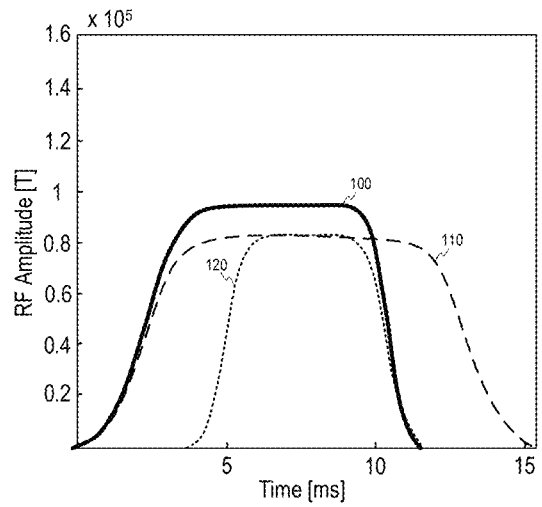
FIGS. 2a through 2d illustrate functions associated with an asymmetric inversion pulse and two symmetric inversion pulses according to some embodiments.
Figure 2B:
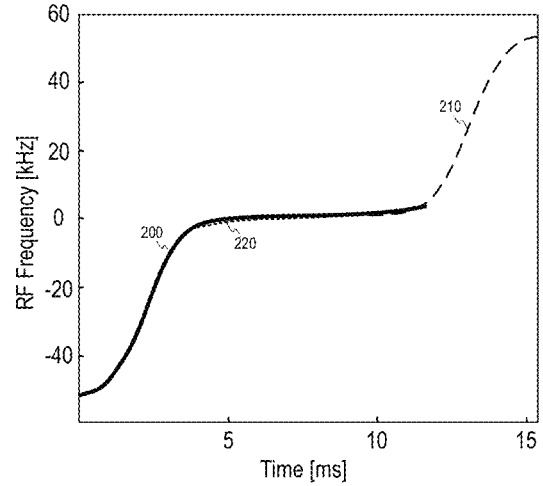
Figure 2C:
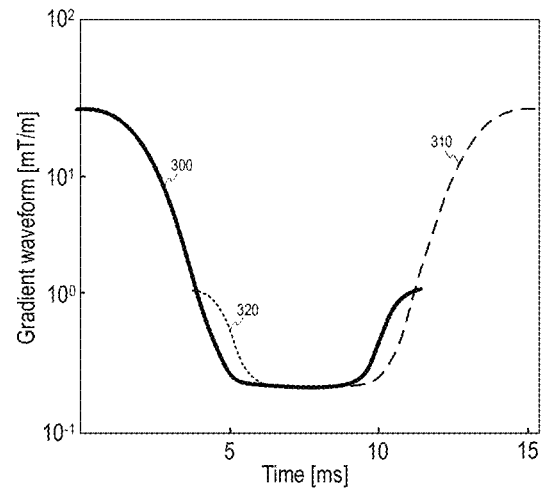
Figure 2D:
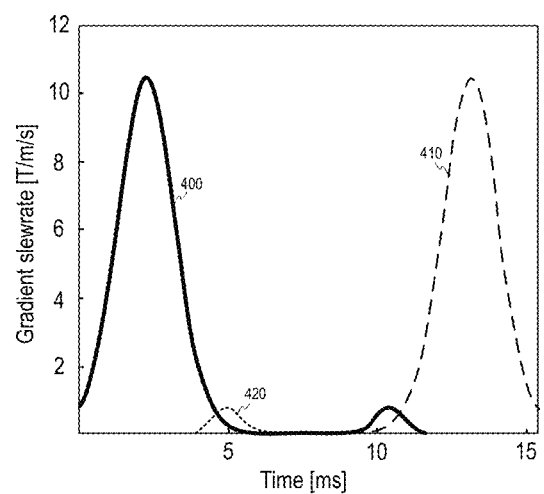

FIGS. 2a through 2d illustrate characteristics of asymmetric adiabatic inversion pulse 100 according to some embodiments. In this illustration, the selective inversion pulses are based on the concept of gradient-modulated offset independent adiabaticity (GOIA). In contrast to conventional selective inversion adiabatic pulses with constant gradient strength during the RF pulse, a GOIA pulse employs a modulated gradient waveform. Typically, the gradient modulation provides increase gradient strength at the leading and trailing ends of the pulse to support faster frequency sweeping (i.e., higher RF frequency modulation) and therefore higher RF bandwidth and more accurate inversion selectivity. Additionally, GOIA provides constant adiabaticity for all frequency offsets, which is in contrast to other techniques. For example, FOCI pulses also employ modulated gradient waveforms, however the modulation functions are arbitrarily defined, which produce inversion profiles that are less than desirable. A gradient-modulated inversion pulse (e.g., GOIA and FOCI pulses) consists of three components, including RF amplitude waveforms, RF frequency or phase waveforms, and gradient waveforms, which are exemplified in FIGS. 2a, 2b and 2c, respectively. The gradient slew-rate, illustrated in FIG. 2d, is also an important quantity, as it is limited by performance limits of the scanner's gradient system.

As described above, such inversion pulses may be used in applications where inversion of only half of the ROI is needed, or where good selectivity is only needed on one side of the inversion region. Generally, one half of the inversion pulse focuses on slice selection, while the other half assists in reducing overall SAR and pulse duration.

Pulse 100 of FIG. 2a is formed by combining the desirable characteristics of two different GOIA pulses, standard symmetric GOIA pulse 110 (i.e., dashed line) and standard symmetric lower-BW GOIA pulse 120 (i.e., dotted line). According to some embodiments, GOIA pulses 110 and 120 are first designed separately with distinct desirable properties. For example, GOIA pulse 110 exhibits a high bandwidth (BW) (e.g., more than 50 kHz) and high maximum gradient strength (e.g., 25 mT/m) in order to achieve accurate selectivity. GOIA pulse 120 is designed with a low BW (e.g., approximately 5 kHz) and lower gradient strength (e.g., 1.2 mT/m).

The second half of pulse 100 therefore quickly ramps down the RF amplitude and gradient waveforms while still maintaining same adiabaticity as the first half, in order to achieve similar inversion homogeneity with the same $B_1$ amplitude. As a result, pulse 100 of the present example is 25% shorter and has an incidentally 25% lower SAR than GOIA pulse 110.

Figure 3:
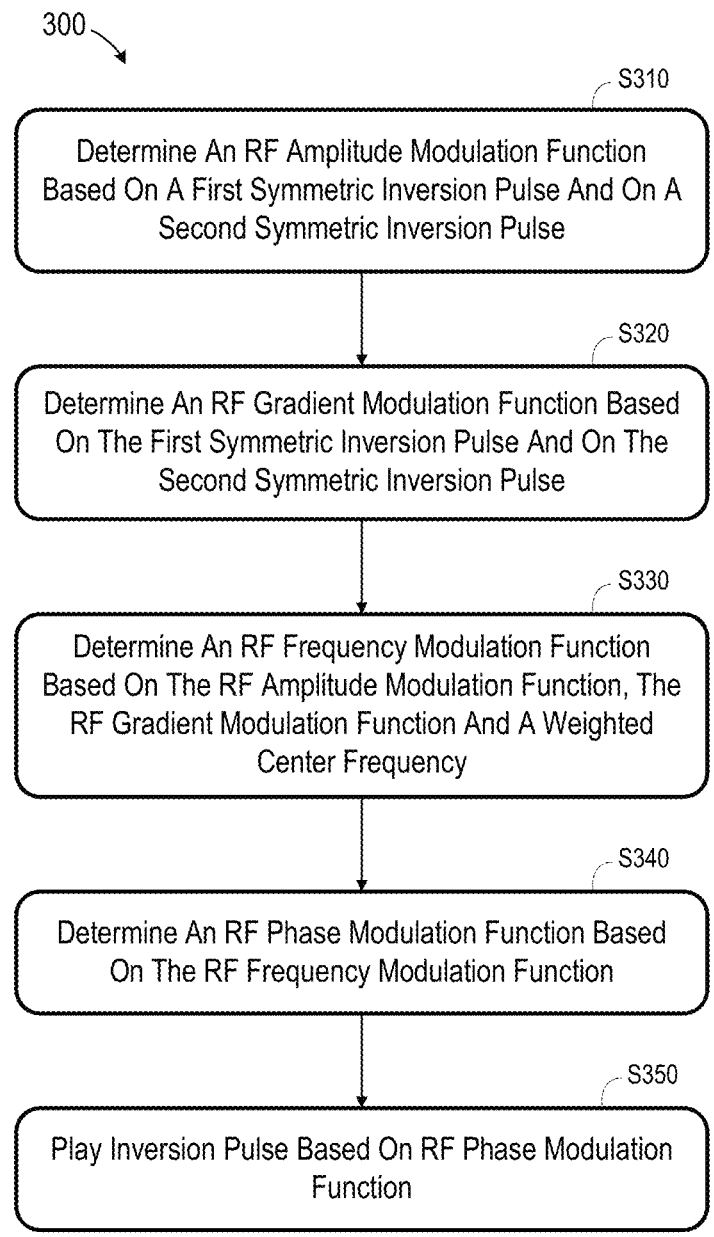
FIG. 3 is a flow diagram of a process to determine an inversion pulse according to some embodiments.

FIG. 3 is a flowchart of process 300 according to some embodiments. Process 300 may be executed in some embodiments to determine an asymmetric adiabatic inversion pulse which may be played out by an MR scanner. In some embodiments, various hardware elements of system 1 (e.g., one or more processors) execute program code to perform process 300.

Process 300 and all other processes mentioned herein may be embodied in processor-executable program code read from one or more of non-transitory computer-readable media, such as a disk-based or solid-state hard drive, CD-ROM, a DVD-ROM, a Flash drive, and a magnetic tape, and then stored in a compressed, uncompiled and/or encrypted format. In some embodiments, hard-wired circuitry may be used in place of, or in combination with, program code for implementation of processes according to some embodiments. Embodiments are therefore not limited to any specific combination of hardware and software.

Initially, at S310, an RF amplitude modulation function ($F_1$) is determined. According to some embodiments, the RF amplitude modulation function may be determined based on a first symmetric inversion pulse (e.g., pulse 110) with $N_1$ time samples and a second symmetric inversion pulse (e.g., pulse 120) with $N_2$ time samples. Since the dwell time between samples is kept constant, the durations of the two symmetric pulses are proportional to the number of time samples.

Figure 4:
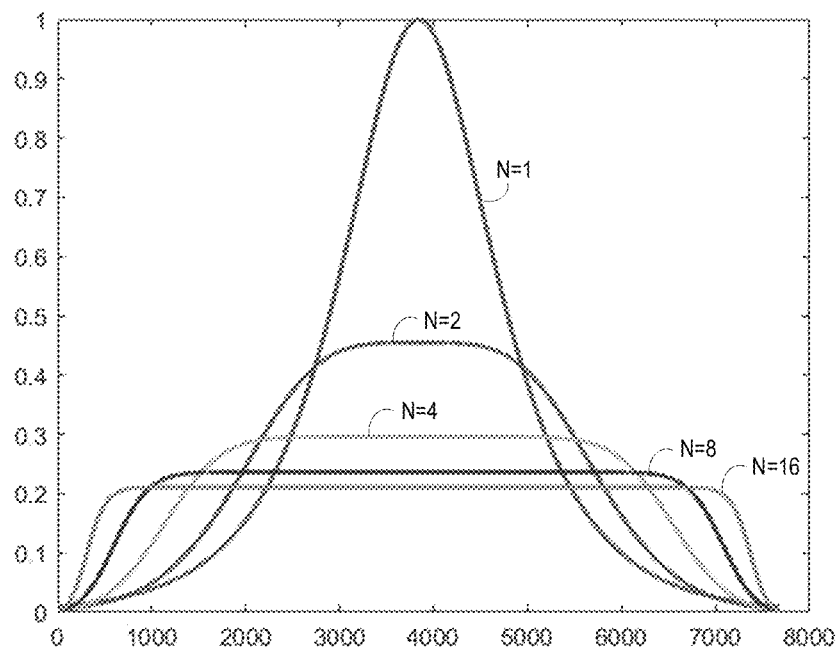
FIG. 4 illustrates the effect of parameter N on the "flatness" of an amplitude modulation profile according to some embodiments.

More specifically, the RF amplitude modulation function may be determined at S310 as a function combining the first half of pulse 110 of FIG. 2a with the second half of pulse 120 of FIG. 2a, as described by the equation below. In the equation, $\beta$ is a dimensionless scaling factor, generally determined such that sech($\beta$)=0.01 (i.e., 1% of peak amplitude). N adjusts the "flatness" of the amplitude modulation profile, as illustrated in FIG. 4. A flat profile is desirable to avoid the high peak voltage associated with a hyperbolic secant pulse (N=1).

According to some embodiments, an RF amplitude modulation function $F_1(\tau)$ is determined at S310 to be a $N^{th}$ order hyperbolic secant function, which has a general form sech($\beta\tau^N$). In the example shown in FIG. 2a, the 4-th order hyperbolic secant profile was employed (N=4); Pulses 110 and 120 have durations of 15.36 and 7.68 ms, respectively; Pulse 100 has a duration of 11.52 ms, with $N_1$=7680 and $N_2$=3840, and a dwell time of 1 us. Other choices of dwell time are possible, as long as the chosen dwell time is supported by the RF signal transmitter chain, such as, sequence controller 10 and digital-analog converters 14a-14b.

$$F_1 = \begin{cases} \text{sech}\left[\beta\left(\frac{n-N_1}{N_1}\right)^N\right], & 1 \leq n < N_1 \\ \text{sech}\left[\beta\left(\frac{n-N_1}{N_2}\right)^N\right], & N_1 \leq n \leq N_2 \end{cases}$$

Next, a gradient modulation function is determined at S320. The gradient modulation function ($F_3$) may be determined based on a first symmetric GOIA gradient modulation function (e.g., pulse 310) and a second symmetric GOIA gradient modulation function (e.g., pulse 320), as illustrated by the relationship between pulses 300, 310 and 320 shown in FIG. 2c. According to some embodiments, the gradient modulation function $F_3$ is determined as 1−$\lambda$sech($\beta\tau^M$) at S320, where $\lambda$ is used to determine the shape of the gradient modulation function ($F_3$).

Figure 5:
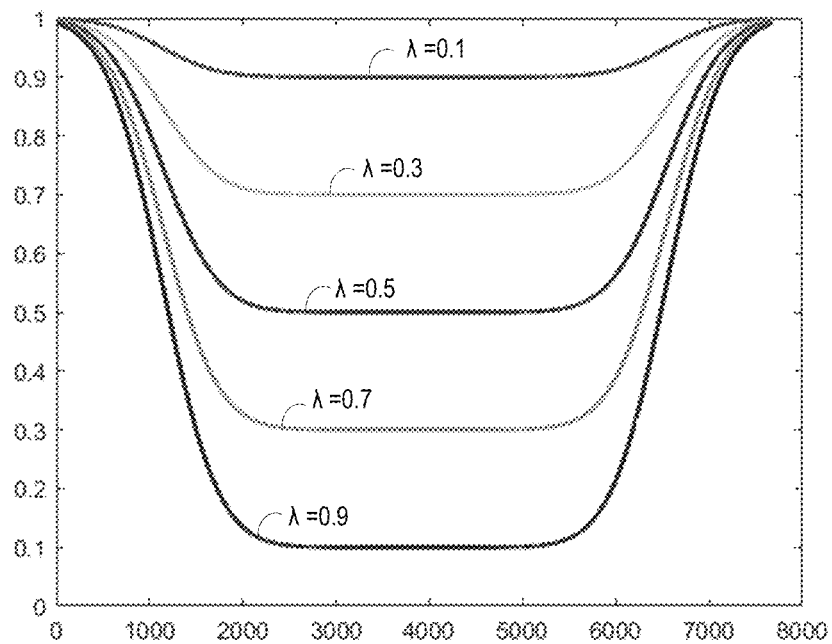
FIG. 5 illustrates the effect of varying λ on the profile of $F_3$ according to some embodiments.

FIG. 5 illustrates the effect of varying $\lambda$ on the profile of $F_3$. The amount of gradient modulation is further scaled by the maximum gradient amplitude. In the present example in FIG. 2c, $\lambda$ was set at 0.9885 and 0.8 for the first and second halves of the asymmetric adiabatic inversion pulse (pulse 300), respectively. The first half of the maximum gradient amplitude is set at 20 mT/m, which is below the hardware limit; whilst the second half maximum gradient amplitude is adjusted to 1.1 mT/m to compensate for the difference in A values of the two halves. Therefore, the two halves of F3 form a continuous profile.

$$F_3 = \begin{cases} 1 - \lambda\,\text{sech}\left[\beta\left(\frac{n-N_1}{N_1}\right)^M\right], & 1 \leq n < N_1 \\ 1 - \lambda\,\text{sech}\left[\beta\left(\frac{n-N_1}{N_2}\right)^M\right], & N_1 \leq n \leq N_2 \end{cases}$$

An RF frequency modulation function ($F_2$) is determined at S330 based on the determined RF amplitude modulation function ($F_1$) and gradient modulation function ($F_3$). According to some embodiments, with the RF amplitude waveform $B_1(t)=B_1F_1(t)$ $F_1$, RF frequency waveform $\omega(t)=F_2(t)$, and the gradient modulation waveform $G(t)=GF_3(t)$, the adiabatic condition of the gradient modulated adiabatic pulse is:

$$Q(\Omega, t) = \frac{[(B_1(t))^2 + (\omega(t) - \gamma z G(t) - \Omega)^2]^{3/2}}{\left|(\omega(t) - \gamma z G(t) - \Omega)\dot{B}_1(t) - B_1(t)(\dot{\omega}(t) - rz\dot{G}(t))\right|} \gg 1$$

where $B_1$ and G are the maximum RF and gradient amplitude respectively, $\Omega$, is the chemical shift offset. By imposing a constant adiabatic factor for all chemical shifts, we arrive at:

$$Q\left[\dot{\omega}(t) - \frac{\omega(t)}{G(t)}\dot{G}(t)\right] = B_1^2(t)$$

Theoretically, any one of functions $B_1(t)$, $\omega(t)$, and $G(t)$ may be determined from any other two of the functions. In practice, however, it may be preferable to determine the RF amplitude waveform and gradient waveform to calculate the RF frequency waveform therefrom, to ensure that the RF amplitude and gradient amplitude are within the hardware specifications (e.g., maximum RF amplitude, maximum gradient strength and slew rate) of the MR system. Accordingly, the RF frequency modulation function can be determined at S330 as:

$$\omega(t) = \frac{1}{Q} G(t) \int_0^t \frac{B_1^2(t)}{G(t)} dt - \omega_c$$

where $w_c$ is the center frequency at the center point of the waveform. For the 11.52 ms pulse of the present examples, the center frequency $w_c$ should be evaluated at the 7.5 ms center of the "normal" GOIA pulse on which the asymmetric adiabatic inversion pulse is based, instead of at the center of the final pulse duration (5.625 ms). Since the RF frequency modulation function is directly calculated, it will provide a continuous phase modulation with no phase discontinuity between the two halves of the resulting asymmetric pulse.

An RF phase waveform is determined at S340 based on the RF frequency waveform ω(t). The following function includes the previous function and may therefore be used to determine the RF phase waveform from the RF frequency waveform or directly from the RF amplitude waveform $B_1(t)$ and the gradient waveform G(t):

$$\varphi(t) = 2\pi \int_0^t \left[ \frac{1}{Q} G(\tau) \int_0^\tau \frac{B_1^2(\tau)}{G(\tau)} d\tau - \omega_c \right] dt + \varphi(0)$$

The RF phase waveform is determined because the RF frequency waveform is typically achieved by RF phase modulation of the RF hardware. Accordingly, at S350, the inventive inversion pulse may be played by an MR scanner during a suitable imaging application based on the RF phase modulation function.

Figure 6A:
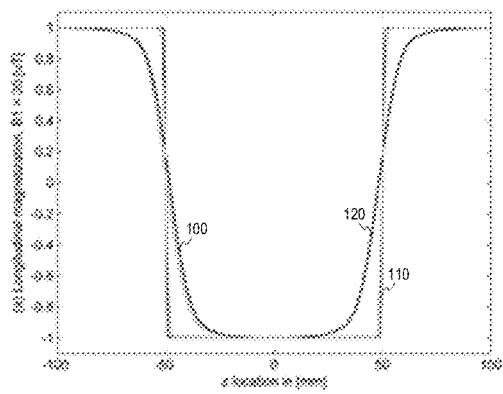
FIGS. 6a through 6d illustrate longitudinal magnetizations associated with an asymmetric inversion pulse and two symmetric inversion pulses at different $B_1$ amplitudes according to some embodiments.
Figure 6B:
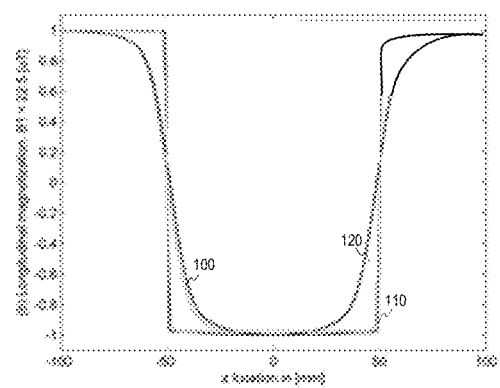
Figure 6C:
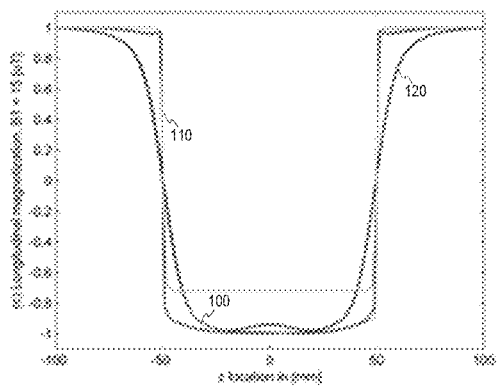
Figure 6D:
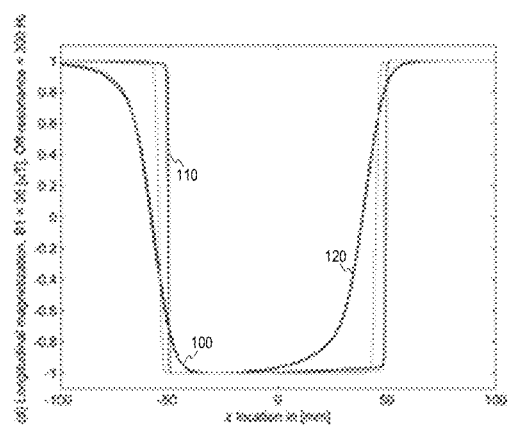

FIGS. 6a and 6b are Bloch simulations illustrating that with sufficient B1 amplitudes, such as at 30 and 22.5 uT, the inversion profile of asymmetric adiabatic pulse 100 according to some embodiments follows that of standard GOIA pulse 110 on the critical edge and that of lower-BW GOIA pulse 120. If the B1 amplitude is critically low, such as 15 uT as shown in FIG. 6c, all pulses maintained their respective inversion profiles. In the event of B0 off-resonance as in FIG. 6d, although pulse 100 exhibits a selectivity shift at the uncritical edge (i.e., similar to lower-BW GOIA pulse 120), pulse 100 inherits the selectivity of standard GOIA pulse 110 at the critical edge. Pulse 100 is therefore suitable for single-side high-selectivity applications while providing significant improvement over pulse 110 with respect to pulse duration and SAR.

The foregoing diagrams represent logical architectures for describing processes according to some embodiments, and actual implementations may include more or different components arranged in other manners. Other topologies may be used in conjunction with other embodiments. Moreover, each component or device described herein may be implemented by any number of devices in communication via any number of other public and/or private networks. Two or more of such computing devices may be located remote from one another and may communicate with one another via any known manner of network(s) and/or a dedicated connection. Each component or device may comprise any number of hardware and/or software elements suitable to provide the functions described herein as well as any other functions. For example, any computing device used in an implementation of a system according to some embodiments may include a processor to execute program code such that the computing device operates as described herein.

All systems and processes discussed herein may be embodied in program code stored on one or more non-transitory computer-readable media. Such media may include, for example, a floppy disk, a CD-ROM, a DVD-ROM, a Flash drive, magnetic tape, and solid state Random Access Memory (RAM) or Read Only Memory (ROM) storage units. Embodiments are therefore not limited to any specific combination of hardware and software.

Embodiments described herein are solely for the purpose of illustration. Those in the art will recognize other embodiments may be practiced with modifications and alterations to that described above.

What is claimed is:

1. A system comprising:
    a chassis defining a bore;
    a main magnet to generate a polarizing magnetic field within the bore;
    a gradient system to apply a gradient magnetic field to the polarizing magnetic field;
    a radio frequency system to apply a pulse to patient tissue disposed within the bore and to receive signals from the patient tissue; and
    a computing system to execute program code to:
        determine a first gradient-modulated offset-independent adiabaticity pulse associated with a first bandwidth and a first maximum gradient strength;
        determine a second gradient-modulated offset-independent adiabaticity pulse associated with a second bandwidth less than the first bandwidth and a second maximum gradient strength less than the first maximum gradient strength;
        determine an asymmetric adiabatic pulse based on the first gradient-modulated offset-independent adiabaticity pulse and the second gradient-modulated offset-independent adiabaticity pulse; and
        control the radio frequency system and the gradient system to apply the asymmetric adiabatic pulse to patient tissue.

2. A system according to claim 1, wherein determination of the asymmetric adiabatic pulse comprises:
    concatenation of a first half of the first gradient-modulated offset-independent adiabaticity pulse with a second half of the second gradient-modulated offset-independent adiabaticity pulse.

3. A system according to claim 1, wherein determination of the asymmetric adiabatic pulse comprises:
    determination of a radio frequency (RF) amplitude waveform based on an RF amplitude waveform of the first gradient-modulated offset-independent adiabaticity pulse and an RF amplitude waveform of the second gradient-modulated offset-independent adiabaticity pulse;
    determination of a gradient waveform based on a gradient waveform of the first gradient-modulated offset-independent adiabaticity pulse and a gradient waveform of the second gradient-modulated offset-independent adiabaticity pulse; and
    determination of an RF phase waveform based on an RF phase waveform of the first gradient-modulated offset-independent adiabaticity pulse and an RF phase waveform of the second gradient-modulated offset-independent adiabaticity pulse.

4. A system according to claim 3, wherein concatenation of phase waveforms comprises adjustment of the phase difference between the first half and the second half.

5. A system according to claim 4, wherein determination of the RF phase waveform ($\varphi(t)$) based on the RF amplitude modulation function ($F_1(t)$) and the gradient modulation function ($F_3(t)$) is based on the following, where $B_1(t)=B_1F_1(t)$, and $G(t)=GF_3(t)$, and where $B_1$ is the maximum RF amplitude of the waveform and G is the maximum gradient amplitude of the waveform:

$$\varphi(t) = 2\pi \int_0^t \left[ \frac{1}{Q} G(\tau) \int_0^\tau \frac{B_1^2(\tau)}{G(\tau)} d\tau - \omega_c \right] dt + \varphi(0)$$

6. A system according to claim 1, wherein the RF amplitude modulation function comprises a $N^{th}$-order hyperbolic secant function (sech ($\beta t^N$)), and
wherein the gradient modulation function comprises $1-\lambda\text{sech}(\beta t^M)$.

7. A computer-implemented method comprising:
determining a first gradient-modulated offset-independent adiabaticity pulse associated with a first bandwidth and a first maximum gradient strength;
determining a second gradient-modulated offset-independent adiabaticity pulse associated with a second bandwidth less than the first bandwidth and a second maximum gradient strength less than the first maximum gradient strength;
determining an asymmetric adiabatic pulse based on the first gradient-modulated offset-independent adiabaticity pulse and the second gradient-modulated offset-independent adiabaticity pulse; and
controlling the radio frequency system and the gradient system to apply the asymmetric gradient-modulated adiabatic pulse to patient tissue.

8. A method according to claim 7, wherein determination of the asymmetric adiabatic pulse comprises:
concatenating a first half of the first gradient-modulated offset-independent adiabaticity pulse with a second half of the second gradient-modulated offset-independent adiabaticity pulse.

9. A method according to claim 8, wherein concatenating comprises adjusting the maximum gradient strength of the second half of the gradient waveform of the second gradient-modulated offset-independent adiabaticity pulse so as to create a continuous gradient waveform after concatenation.

10. A method according to claim 7, wherein determining the asymmetric adiabatic pulse comprises:
determining a radio frequency (RF) amplitude waveform based on an RF amplitude waveform of the first gradient-modulated offset-independent adiabaticity pulse and an RF amplitude waveform of the second gradient-modulated offset-independent adiabaticity pulse;
determining an gradient waveform based on an gradient waveform of the first gradient-modulated offset-independent adiabaticity pulse and an gradient waveform of the second gradient-modulated offset-independent adiabaticity pulse; and
determining an RF phase waveform based on the RF amplitude waveform and the gradient waveform.

11. A method according to claim 10, wherein the RF amplitude modulation function comprises a $N^{th}$-order hyperbolic secant function (sech ($\beta \tau^N$)), and
wherein the gradient modulation function comprises $1-\lambda\text{sech}(\beta \tau^M)$.

12. A method according to claim 10, wherein determining the RF phase waveform ($\varphi(t)$) based on the RF amplitude modulation function ($F_1(t)$) and the gradient modulation function ($F_3(t)$) is based on the following, where $B_1(\tau)=B_1F_1(\tau)$, and $G_3(\tau)=GF_3(\tau)$, and where $B_1$ is the maximum RF amplitude of the waveform and G is the maximum gradient amplitude of the waveform:

$$\varphi(t) = 2\pi \int_0^t \left[ \frac{1}{Q} G(\tau) \int_0^\tau \frac{B_1^2(\tau)}{G(\tau)} d\tau - \omega_c \right] dt + \varphi(0)$$

13. A system comprising:
a chassis defining a bore;
a main magnet to generate a polarizing magnetic field within the bore;
a gradient system to apply a gradient magnetic field to the polarizing magnetic field;
a radio frequency system to apply a pulse to patient tissue disposed within the bore and to receive signals from the patient tissue; and
a computing system to execute program code to:
determine a radio frequency (RF) amplitude waveform of an asymmetric adiabatic pulse;
determine a gradient waveform of the asymmetric adiabatic pulse;
determine an RF phase waveform of the asymmetric adiabatic pulse based on the RF amplitude waveform and the gradient waveform; and
control the radio frequency system and the gradient system to apply the asymmetric adiabatic pulse to patient tissue based on the RF phase waveform.

14. A system according to claim 13, wherein the RF amplitude modulation function comprises a $N^{th}$-order hyperbolic secant function (sech ($\beta \tau^N$)), and
wherein the gradient modulation function comprises $1-\lambda\text{sech}(\beta \tau^M)$.

15. A system according to claim 13, wherein determination of the RF phase waveform ($\varphi(t)$) based on the RF amplitude modulation function ($F_1(\tau)$) and the gradient modulation function ($F_3(t)$) is based on the following, where $B_1(\tau)=B_1F_1(\tau)$, and $G_3(\tau)=GF_3(\tau)$, and where $B_1$ is the maximum RF amplitude of the waveform and G is the maximum gradient amplitude of the system:

$$\varphi(t) = 2\pi \int_0^t \left[ \frac{1}{Q} G(\tau) \int_0^\tau \frac{B_1^2(\tau)}{G(\tau)} d\tau - \omega_c \right] dt + \varphi(0)$$

* * * * *